United States Patent [19]

Gabara

[11] Patent Number: 5,043,605
[45] Date of Patent: Aug. 27, 1991

[54] CMOS TO ECL OUTPUT BUFFER

[75] Inventor: Thaddeus J. Gabara, Schnecksville, Pa.

[73] Assignee: AT&T Bell Laboratories, Murray Hill, N.J.

[21] Appl. No.: 371,356

[22] Filed: Jun. 26, 1989

[51] Int. Cl.[5] .................. H03K 19/003; H03K 19/086
[52] U.S. Cl. .............................. 307/475; 307/296.6; 307/443; 307/451
[58] Field of Search ..................... 307/296.6, 360, 443, 307/451, 475, 296.7, 296.8

[56] References Cited

U.S. PATENT DOCUMENTS

| | | | |
|---|---|---|---|
| 4,251,743 | 2/1981 | Hareyama | 307/296.6 |
| 4,281,260 | 10/1978 | Moegen et al. | 307/296.8 |
| 4,410,815 | 10/1983 | Ransom et al. | 307/475 |
| 4,453,094 | 6/1984 | Peil et al. | 307/296.8 |
| 4,458,200 | 7/1984 | Geller | 307/296.6 |
| 4,496,856 | 1/1985 | Ransom et al. | 307/448 |
| 4,614,882 | 9/1986 | Parker et al. | 307/475 |
| 4,656,375 | 4/1987 | Lauffer et al. | 307/296.6 |
| 4,691,127 | 9/1987 | Huize | 307/296.8 |
| 4,714,901 | 12/1987 | Jain et al. | 307/296.8 |
| 4,751,406 | 6/1988 | Wilson | 307/296.6 |
| 4,775,810 | 10/1988 | Suzuki et al. | 307/448 |
| 4,782,251 | 11/1988 | Tsugaru et al. | 307/475 |
| 4,841,175 | 6/1989 | De Man et al. | 307/475 |
| 4,890,019 | 12/1989 | Hoyte et al. | 307/475 |
| 4,893,030 | 1/1990 | Shearer et al. | 307/296.8 |
| 4,912,347 | 3/1990 | Morris | 307/475 |
| 4,945,258 | 7/1990 | Picard et al. | 307/475 |
| 4,947,061 | 8/1990 | Metz et al. | 307/475 |

OTHER PUBLICATIONS

Fairchild F100K ECL Data Book, pp. 3-38 to 3-40 (1986).

Meier et al., "A 2 μm CMOS Digital Adaptive Equalizer Chip for QAM Digital Radio Modems," IEEE International Solid-State Circuits Conference Digest of Papers, pp. 64-65 and 302-303 (1988).

Chao et al., "A 140 Mbit/s CMOS LSI Frame Chip for a Broad-Band ISDN Local Access System," IEEE Journal of Solid-State Circuits, vol. 23, pp. 133-141, (1988).

Primary Examiner—Stanley D. Miller
Assistant Examiner—Terry D. Cunningham
Attorney, Agent, or Firm—L. H. Birnbaum

[57] ABSTRACT

Disclosed is an output buffer which utilizes CMOS components to convert from CMOS to ECL voltages. The circuit includes a field effect transistor and an external resistor for providing both high and low voltages by applying to the gate of the field effect transistor appropriate control voltages.

8 Claims, 3 Drawing Sheets

CMOS TO ECL OUTPUT BUFFER

BACKGROUND OF THE INVENTION

This invention relates to buffer circuits for converting from voltages appropriate for Complimentary Metal Oxide Silicon (CMOS) circuitry to voltages compatible with Emitter Coupled Logic (ECL) circuitry.

In many systems, especially those requiring high speed data links, a need exists to provide effective interconnection between integrated circuit chips employing CMOS technology and chips employing ECL circuitry. The problem arises because CMOS circuits generally operate with logic swings between 0→5 volts, while ECL chips operate with logic swings between $-0.95 \rightarrow -1.7$ volts.

A traditional method of achieving the appropriate voltage swing is to provide a bipolar buffer circuit in a chip which is external to the CMOS chip (see, e.g., Fairchild F100K ECL Data Book, pp. 3-38 to 3-40 (1986)). It would be more desirable based on performance and cost factors to provide a CMOS output buffer incorporated into the CMOS chip itself for interconnection chip.

Some suggestions have been made recently to provide a CMOS output buffer circuit. For example, in Meier, "A 2 μm CMOS Digital Adaptive Equalizer Chip...," *IEEE International Solid State Circuits Conference Digest of Technical Papers*, pp. 64-65 and 302-303 (1988), the lower level voltage is established by an external power supply. The upper voltage level is set by an MOS transistor acting as a current source which mirrors the current through a series of transistors in another branch. Thus, only the upper voltage level is controlled by the circuit.

It has also been proposed to provide the upper and lower voltages by coupling high and low reference voltages to the gates of separate transistors in separate branches of the buffer circuit. A third transistor controls whether one or both branches will be coupled to the buffer output thereby determining if the lower voltage level or upper voltage level is set. (See U.S. patent application Ser. No. 310,407 of P. C. Metz and R. L. Pritchett, Ser. No. 310,407, filed Feb. 13, 1989, which is incorporated by reference herein.)

It is an object of the invention to provide an alternative output buffer circuit as part of a CMOS integrated circuit chip for setting voltage levels for connection to ECL logic chips.

SUMMARY OF THE INVENTION

This and other objects are achieved in accordance with the invention which is an output buffer circuit. The circuit comprises an MOS transistor coupled to the output of the circuit, the transistor including a gate electrode. Means are provided for alternatively supplying to the gate electrode a pair of reference voltages so that the transistor establishes a voltage level at the circuit output for each of said reference voltages which is compatible with an emitter coupled logic circuit connected to the output. The transistors are integrated into a single semiconductor chip, and at least one resistor external to the chip is also provided for supplying the reference voltages.

BRIEF DESCRIPTION OF THE DRAWING

These and other features of the invention are delineated in detail in the following description. In the drawing.

DETAILED DESCRIPTION

Figure 1:
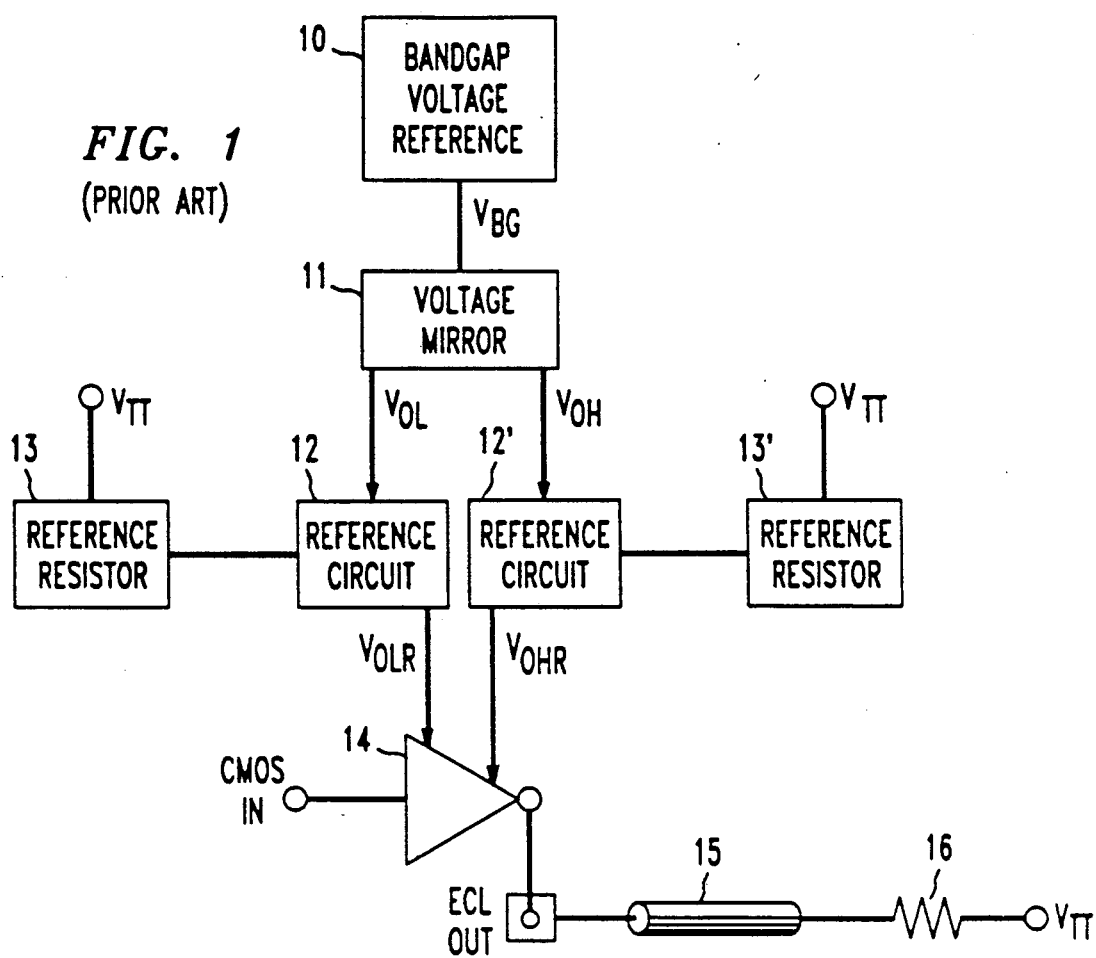
FIG. 1 is a schematic block diagram of a circuit incorporating an output buffer in accordance with an embodiment of the invention.

FIG. 1 illustrates an overall view of a circuit which includes conversion of CMOS voltage levels to ECL voltage levels. A standard bandgap voltage reference circuit, 10, generates a voltage $V_{BG}$ which is independent of temperature and power supply voltage. The bandgap reference circuit is coupled to a standard voltage mirror circuit, 11, where $V_{BG}$ is converted to low and high voltages, $V_{OL}$ and $V_{OH}$, respectively. Typically, $V_{BG}$ is approximately $V_{SS} + 1.23$ volts, while $V_{OL}$ is approximately $V_{DD} - 1.7$ volts and $V_{OH}$ is approximately $V_{DD} - 0.95$ volts. $V_{SS}$ is the most negative supply voltage to the CMOS chip (typically $-5$ volts) and $V_{DD}$ is the most positive voltage (typically 0 volts).

These circuits are fairly standard in the art and are therefore not discussed in detail.

The voltages, $V_{OL}$ and $V_{OH}$ are coupled to reference circuits 12', which, together with reference resistors, 13', provide low and high reference voltages, $V_{OLR}$ and $V_{OHR}$, respectively, for the output buffer circuit, 14. $V_{OLR}$ is typically $-1.7$ volts and $V_{OHR}$ is typically $-3.0$ volts. The buffer circuit, 14, receives CMOS voltage levels at its input terminal designated "CMOS In" from the CMOS integrated circuit chip and converts to voltage levels compatible with ECL chips at its output designated "ECL Out." The signal is sent along a transmission path, 15, to some ECL chip (not shown).

Figure 2:
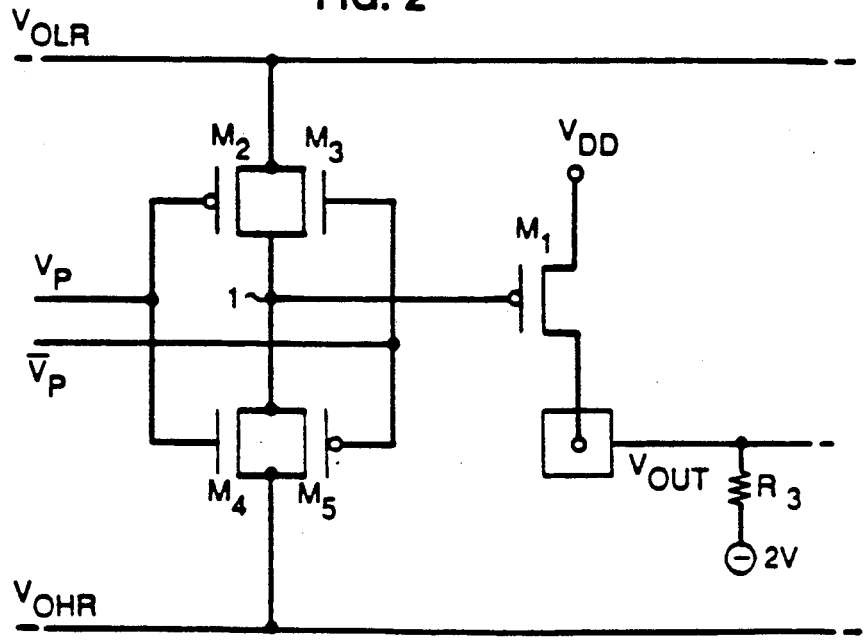
FIG. 2 is a schematic circuit diagram of a portion of the circuit of FIG. 1 in accordance with an embodiment of the invention.

FIG. 2 illustrates the output buffer circuit, 14. The output voltage, $V_{out}$, for connection to an ECL chip (not shown) is established by an MOS Transistor, $M_1$, which is preferably a p-channel device. The drain of the transistor is coupled to the output terminal, while the source is coupled to a potential of $V_{DD}$ (0 volts). $V_{out}$ is controlled by the application of appropriate reference voltages $V_{OLR}$ or $V_{OHR}$ to the gate of transistor $M_1$. Transistors $M_2$, $M_3$, $M_4$, and $M_5$ serve as transmission gates to apply the reference voltages alternatively to the gate of $M_1$. $M_2$ and $M_5$ are p-channel transistors, while $M_3$ and $M_4$ are n-channel transistors. The source and drain of $M_2$ and $M_3$, respectively, are coupled in common to $V_{OLR}$ and their drain and source are coupled in common at node 1 which is coupled to the gate of $M_1$. Similarly, the source and drain of $M_4$ and $M_5$, respectively, are coupled in common to $V_{OHR}$ and also have their drain and source coupled to node 1. A voltage pulse train $V_p$ is applied in common to the gates of $M_2$ and $M_4$ while $\overline{V_p}$, which is 180 degrees out of phase with $V_p$, is applied to the gates of $M_3$ and $M_5$. Typically, $V_p$ varies from 0 to $-5$ volts and has a frequency of approximately 250 MHZ.

Since $V_p$ and $\overline{V}_p$ are 180 degrees out of phase, only $M_2$ and $M_3$ or $M_4$ and $M_5$ will be enabled at a particular time. Thus, when $V_p$ is low and $\overline{V}_p$ is high, the voltage $V_{OLR}$ appears at node 1 and is applied to $M_1$. When $V_p$ is high and $\overline{V}_p$ is low, the voltage $V_{OHR}$ will be applied to $M_1$.

In this particular example, $M_1$ has a channel length of approximately 1 μm and a channel width of approximately 550 μm for generating the ECL-compatible voltages $-0.95$ and $-1.7$ volts at $V_{out}$ in response to the application of $V_{OHR}$ and $V_{OLR}$. It is desirable that the high level voltage fall within the range $-0.880$ to $-1.028$ volts and the low level voltage fall within the range $-1.620$ to $-1.810$ volts. Of course, the size of $M_1$ can be varied consistent with the voltages available on the chip.

Figure 3:
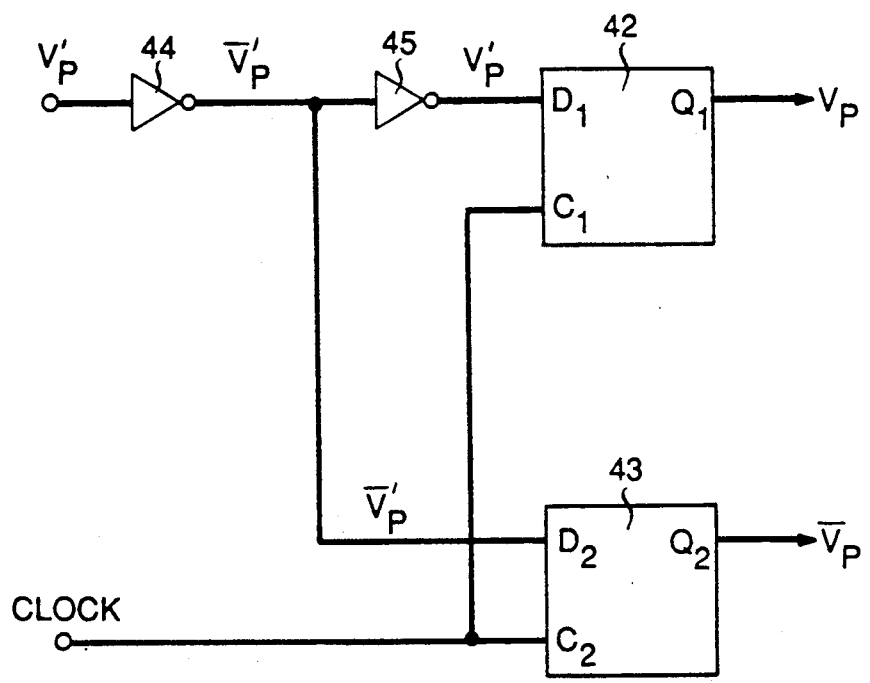
FIG. 3 is another portion of the circuit of FIG. 1 in accordance with an embodiment of the invention.

The voltages $V_p$ and $\overline{V}_p$ which operate the transmission gates can be generated by circuitry such as that shown in FIG. 3. Voltage $V_p^1$ swings between 0 and $-5$ volts. This pulse signal is applied to a first inverter, 44, to produce $\overline{V}_p^1$ which is 180 degrees out of phase with $V_p^1$. This signal ($\overline{V}_p^1$) is supplied to the data input ($D_2$) of a flip-flop circuit, 43. The signal is also supplied to a second inverter, 45, to produce $V_p^1$ which is then applied to the data input ($D_1$) of another flip-flop circuit, 42. An identical clock signal is supplied to the clock inputs ($C_1$ and $C_2$) of the two flip-flops. The signals from the non-inverting outputs ($Q_1$ and $Q_2$) are $V_p$ and $\overline{V}_p$ which are supplied to the transmission gates ($M_2$-$M_5$ of FIG. 2). This particular circuitry is advantageous because there is no significant delay between $V_p$ and $\overline{V}_p$ as a result of inverting the signal before applying to the flip-flop.

Figure 4:
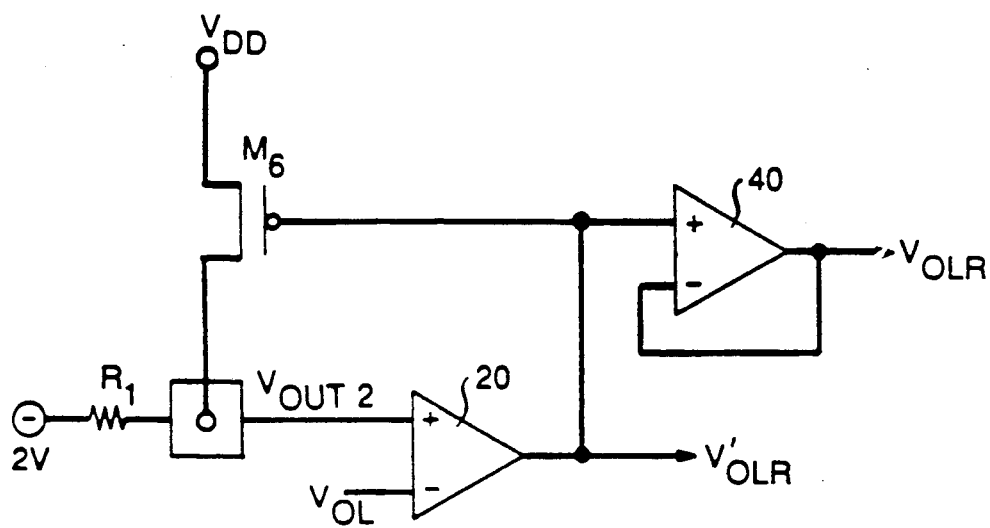
FIGS. 4 and 5 are further portions of the circuit of FIG. 1 in accordance with an embodiment of the invention.
Figure 5:
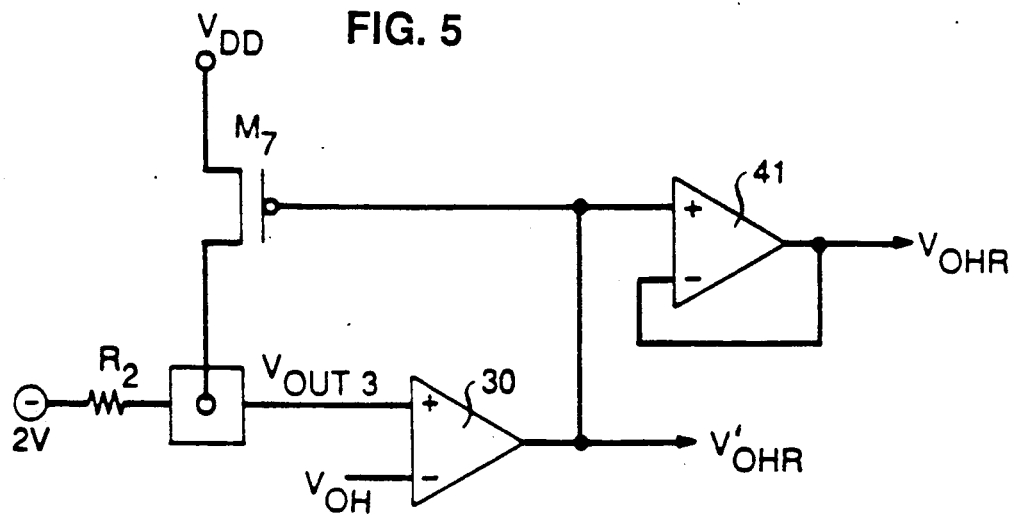

The voltages $V_{OLR}$ and $V_{OHR}$ which are applied to the gate of $M_1$ can be generated by the reference circuits shown in FIGS. 4 and 5. The voltages $V_{OL}$ and $V_{OH}$ from the voltage mirror circuit (11 of FIG. 1) are applied to the negative inputs of separate operational amplifiers 20 and 30, respectively. The outputs of the operational amplifiers, 20 and 30, are coupled to the gates of p-channel MOS transistors $M_6$ and $M_7$, respectively. These transistors are identical to transistor $M_1$ which provides the output voltage for the buffer circuit (FIG. 2). The sources of $M_6$ and $M_7$ are coupled to a terminal at a potential of $V_{DD}$ (0 volts) and their drains are coupled to separate external reference resistors $R_1$ and $R_2$ which typically have a resistance of 50 ohms each. An external bias of approximately $-2$ volts is supplied to the reference resistors $R_1$ and $R_2$ (as well as $R_3$ of FIG. 2) to generate the appropriate voltages compatible with ECL chips. The outputs of operational amplifiers, 20 and 30, are also coupled to unity gain operational amplifiers, 40 and 41, respectively.

In operation, when $V_{OL}$ and $V_{OH}$ are applied to their respective inputs to the Op Amps, 20 and 30, the outputs will enable transistors $M_6$ and $M_7$ causing a current to flow through the transistors and the external reference resistors $R_1$ and $R_2$. The voltage across these resistors $V_{out2}$ and $V_{out3}$ is fed to the positive terminals of their respective Op Amps, 20 and 30. The outputs of the Op Amps will adjust themselves until the inputs at the positive and negative terminals are equal. At this equilibrium, the voltages $V^1_{OLR}$ and $V^1_{OHR}$ will be a stable function of $V_{OL}$ and $V_{OH}$, respectively, from the mirror circuit and the reference resistors $R_1$ and $R_2$, respectively. These voltages can be generated in one portion of the semiconductor chip and buffered by unity gain operational amplifiers, 40 and 41, to form $V_{OLR}$ and $V_{OHR}$ which are routed along the entire input/output frame for use by all output buffers which may be situated on the chip.

Since only a single MOS transistor ($M_1$) generates both ECL voltages, the circuit is simpler than those generally available, occupies less area, and should be faster. A small variation in the voltage, preferably $|V_{OLR}-V_{OHR}|<2$ volts, such that $|V_{OLR}|>|V_{TP}|$ (where $|V_{TP}|$ is the threshold voltage of $M_1$) ensures that $M_1$ will remain on during the operation of the circuit and the circuit will be fast. In addition, the circuit generates little noise, which is due in large part to varying the voltage to the gate so as to amplitude-modulate the current through $M_1$ rather than turning it on and off. This produces no discontinuities in the current which affect the noise factor. For a 0.9 micron technology, a recommended range for the time of transition between the application of $V_{OLR}$ and $V_{OHR}$ is 700 picoseconds-1.8 nanoseconds. For example, when 64 output buffers were switched simultaneously at a clock rate of 175 MHz, only 30 mV of ground bounce was detected in a computer-aided design simulation. The circuit is designed to operate at approximately 175 MHZ, but can operate at speeds of at least 250 MHZ.

Various modifications of the invention as described will become apparent to those skilled in the art. For example, while $M_1$ is preferably a p-channel transistor, an n-channel transistor can also be used if the appropriate voltages for driving such a transistor are available on the chip. In addition, while only a single transistor ($M_1$) is needed to generate the output voltages, it may be beneficial in certain applications to add an additional transistor in parallel therewith. This additional transistor could provide a constant current added to that of $M_1$ thereby reducing the needed current swing of $M_1$. This would permit $M_1$ to be made smaller. All such variations which basically rely on the teachings through which the invention has advanced the art are properly considered to be within the scope of the invention.

I claim:

1. An output buffer circuit comprising:
   an MOS transistor formed in a semiconductor chip and coupled between a voltage source and an output of the chip, said transistor including a gate electrode;
   a first resistor external to the chip and coupled to the output;
   means for applying a constant voltage to the resistor;
   means formed in the chip for alternatively applying, to said gate electrode, a pair of reference voltages so that two voltage levels are established at the circuit output across said resistor in response to said pair of reference voltages applied to the gate electrode, which voltage levels are compatible with an emitter coupled logic circuit connected to said output; and
   means for generating said reference voltages comprising at least a second resistor external to said chip and an operational amplifier which forms a feedback loop with an MOS transistor coupled to the second resistor.

2. The circuit according to claim 1 wherein the MOS transistor is a p-channel device.

3. The circuit according to claim 1 wherein the means for generating said reference voltages further comprises a third resistor external to the chip.

4. The circuit according to claim 3 wherein the means for generating said reference voltages further comprises a second operational amplifier which forms a feedback loop with a further MOS transistor coupled to said third external resistor.

5. The circuit according to claim 1 wherein the voltage levels at the circuit output lie within the ranges −0.880 V to −1.028 V and −1.620 V to −1.810 V.

6. The circuit according to claim 1 wherein the means for applying reference voltages applies said voltages so as to produce a continuous current through said transistor.

7. The circuit according to claim 1 the wherein means for applying the reference voltages comprises of two pairs of MOS transistors which are alternatively conducting and non-conducting.

8. The circuit according to claim 7 further comprising means for biasing gates of the two pairs of MOS transistors, said means comprising a pair of flip-flop circuits with their outputs coupled to each pair of said MOS transistors, and means for inverting a signal to the input of one of said flip-flop circuits while a non-inverted signal is applied to the input of the other of said flip-flop circuits.

* * * * *